United States Patent [19]

Dolikian

[11] 4,433,256
[45] Feb. 21, 1984

[54] LIMITER WITH DYNAMIC HYSTERESIS

[75] Inventor: Arman V. Dolikian, Palatine, Ill.

[73] Assignee: Motorola, Inc., Schaumburg, Ill.

[21] Appl. No.: 395,208

[22] Filed: Jul. 6, 1982

[51] Int. Cl.$^3$ .................. H03K 5/08; H03K 5/153
[52] U.S. Cl. ................... 307/358; 307/359; 307/555; 328/151; 328/169
[58] Field of Search ........... 307/354, 358, 355, 359, 307/350, 540, 555; 328/147, 151, 169, 171, 172, 173, 175; 340/146.3 AC, 146.3 AE, 146.3 AG

[56] References Cited

U.S. PATENT DOCUMENTS

| | | | |
|---|---|---|---|
| 3,566,281 | 2/1971 | Baumann | 307/358 |
| 3,790,894 | 2/1974 | Iizuka et al. | 328/164 |
| 3,879,672 | 4/1975 | Milanes | 330/29 |
| 3,991,379 | 11/1976 | Chadwick et al. | 307/358 |
| 3,995,224 | 11/1976 | Sutphin, Jr. | 328/168 |
| 4,066,977 | 1/1978 | Chambers et al. | 330/129 |
| 4,121,121 | 10/1978 | Gabeler et al. | 307/358 |
| 4,241,455 | 12/1980 | Eibner | 307/358 |
| 4,271,535 | 6/1981 | Fukuhara et al. | 455/309 |

OTHER PUBLICATIONS

IBM Technical Disclosure Bulletin, "Dynamic Threshold Circuit", W. K. Rackl, vol. 15, No. 4, Sep., 1972, pp. 1138–1139.

Primary Examiner—John Zazworsky
Attorney, Agent, or Firm—Joan Pennington; John B. Conklin; James W. Gillman

[57] ABSTRACT

The invention is a limiter circuit with dynamic hysteresis for providing improved distortion immunity at the circuit output in response to an input signal. The limiter circuit includes a positive and negative peak detector. Two weighted averages are taken of the positive and negative peaks, preferably by means of a voltage divider network. The first input to a comparator circuit receives the input signal to the limiter circuit. Different voltages from the voltage divider network are applied to the second input of the comparator circuit so as to create a dynamic hysteresis effect in the comparator circuit. The different voltages are chosen in response to the output voltage from the comparator circuit by means of an analog switch. The comparator circuit includes a fixed hysteresis voltage for stabilizing the limiter circuit at low level voltage input signals.

8 Claims, 4 Drawing Figures

LIMITER WITH DYNAMIC HYSTERESIS

BACKGROUND OF THE INVENTION

The invention relates to limiter circuits or zero-crossing detectors which transform an analog input waveform into a binary digital waveform which is suitable for interface to a signal processor, such as a microprocessor. More particularly, the invention relates to a limiter circuit with dynamic hysteresis which provides a clean limited output signal that has a wide input dynamic range and quick response to changes in DC level of the input waveform.

Text book circuits for limiters (see Burr-Brown "Operational Amplifiers" pages 358-364) solved the problem of glitches caused by noise or harmonic distortion at signal transition points by adding positive feedback or hysteresis to the comparator stage of the limiter. A "glitch" is defined by the IEEE Standard Dictionary of Electrical and Electronics Terms (1972) as a perturbation of the pulse waveform of relatively short duration and of uncertain origin. For specific applications a hysteresis level of a certain percentage of the input peak to peak swing voltage is usually found to be optimal. Currently, limiter circuits have hysteresis loops that are at a fixed level. As the input voltage level goes up or down the percentage of hysteresis with respect to the input voltage level changes so that the improvement provided by the hysteresis is effective only over a narrow range of input voltage levels. Accordingly, there is a need for a limiter circuit which solves the problem of glitches at the limiter output during signal transitions without being limited to operation over a narrow range of input voltage levels.

It is an object of the invention is to provide a limiter circuit with a hysteresis level that is a fixed percentage of the limiter input voltage level.

It is also an object of the invention to provide a limiter circuit with a hysteresis level that is effective over a wide range of input voltage levels.

SUMMARY OF THE INVENTION

The invention is a limiter circuit with dynamic hysteresis for providing improved distortion immunity at the circuit output in response to an input signal. The limiter circuit includes a positive and negative peak detector. Two weighted averages are taken of the positive and negative peaks, preferably in a voltage divider network. The first input to a comparator circuit receives the input signal to the limiter circuit. Different voltages from the voltage divider network are applied to the second input of the comparator circuit so as to create a dynamic hysteresis effect in the comparator circuit. The different voltages are chosen in response to the output voltage from the comparator circuit by means of an analog switch.

The comparator circuit includes a fixed hysteresis voltage for stabilizing the limiter circuit at low level voltage input signals.

DETAILED DESCRIPTION OF THE PREFERRED EMBODIMENT

Figure 1:
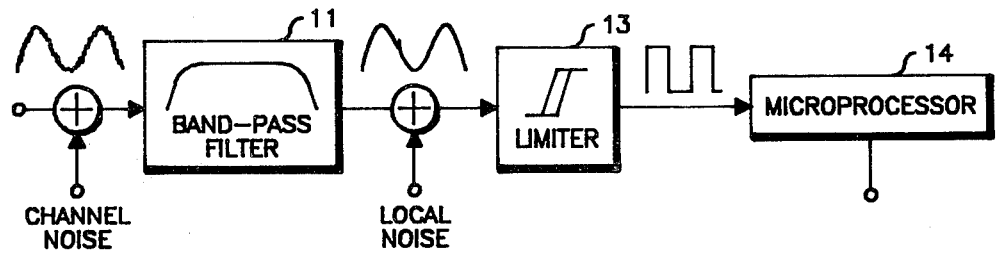
FIG. 1 is a systems block diagram of the intended systems use of the improved limiter circuit.

FIG. 1 shows the application for which the limiter circuit of the invention is intended. The circuit is part of a tone detector signal processing chain. Tone detection is done by passing input signals through an analog band limiting filter 11 and then into a limiter circuit 13. The purpose of the limiter circuit 13 is to transform the analog input waveform into a binary digital waveform suitable for interface to the digital microprocessor 14. The output of the limiter 13 is applied to an input port of a general purpose microcomputer, which further processes the signal and makes a decision about presence or absence of the expected tone. Since often the algorithm used by the microcomputer requires precise measurements be made of the time interval between consecutive edges of the waveform at the limiter output, it is very important that the limiter output signal be without glitches or double transitions. Distortion of the signal at a transition point may be caused by (1) harmonic distortion of the input signal caused by channel non-linearity or (2) local noise from such sources as the power supply or switching transistors. The band-pass filter 11 is a broad band filter. For frequencies at the lower end of the band, their second or possibly even third harmonics may fall within the filter's bandpass. Local noise, as illustrated in FIG. 1, can be added to the signal at a point following the filter 11. Therefore the input to the limiter 13 can be subjected to distortions in the signal that potentially can cause transition distortions at the limiter output.

The limiter 13 solves the transition distortion problem by developing a bias reference signal that is a fixed proportion of the input signal level. This bias signal is used in addition to positive feedback to keep the percentage of hysteresis constant over a 50 db dynamic range. In addition, the limiter circuit 13 can inherently track DC level changes and adapt to them automatically.

Figure 2:
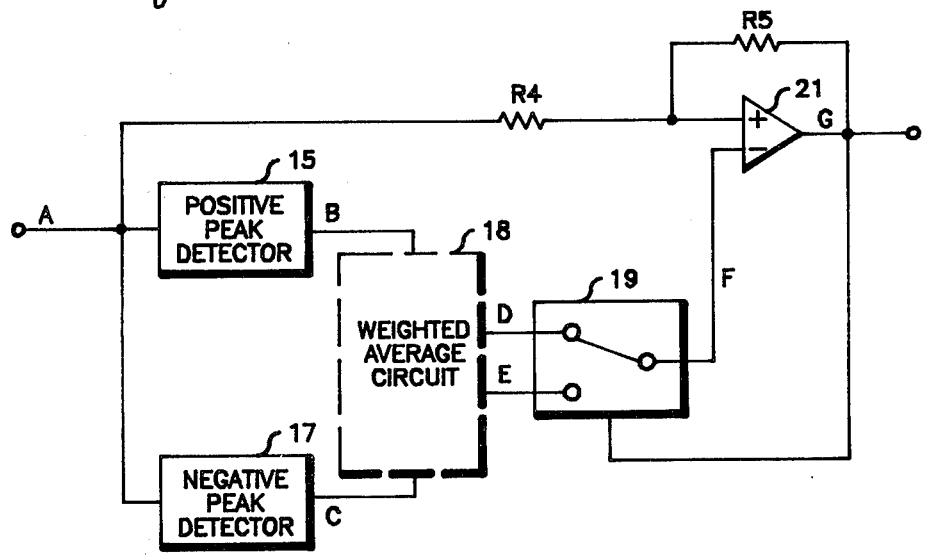
FIG. 2 is a functional block diagram of the limiter circuit with dynamic hysteresis according to the invention.

FIG. 2 shows a functional block diagram of the limiter circuit 13 in FIG. 1. Positive and negative peak detectors, 15 and 17 respectively, are responsive to an analog input signal A from the band limit filter 11 in FIG. 1. The outputs B and C of the peak detectors are input to a weighted average circuit 18. Signals D and E are outputs of the weighted average circuit 18. The relative weight given voltages B and C is different for each of the outputs D and E of the weighted average circuit 18. The weighted average output voltages D and E are applied to an analog switch 19 in FIG. 2. The output of analog switch 19 is a signal F which is applied to the negative input of comparator 21. Positive input of comparator 21 is the input signal A. The output signal G from comparator 21 is the square wave output of the limiter 13 in FIG. 1. The signal G is input to analog switch 19 to provide a control signal for proper operation of the analog switch.

Figure 3:
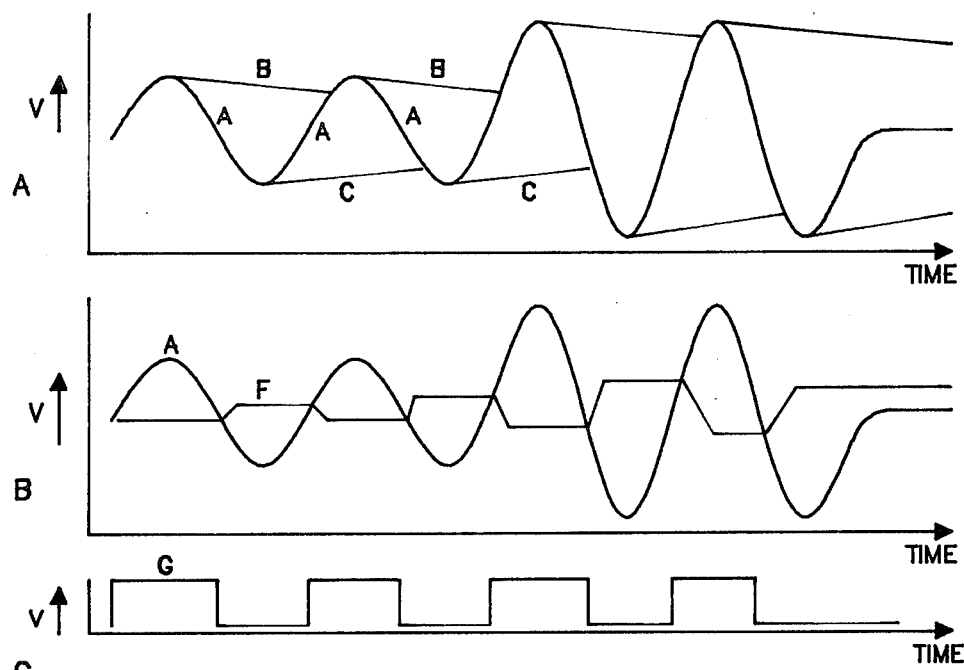
FIGS. 3A-C are waveforms associated with the limiter with dynamic hysteresis shown in FIG. 2.

FIGS. 3A-C show the waveform for the various input output signals associated with FIG. 2. FIG. 3A shows the input and output waveforms associated with the positive peak detector 15 and the negative peak detector 17. Waveform A in FIG. 3A varies in amplitude over time. The waveform B represents the positive peak detection output from positive peak detector 15. Correspondingly, waveform C represents the negative peak-to-peak detection of waveform A occurring in negative peak detector 17. FIG. 3B shows the input waveforms to comparator 21. Waveform F is the output from analog switch 19. Waveform F provides the input signal to the negative input of comparator 21. The amplitude of waveform F in FIG. 3B is directly related to the peak amplitude of the input signal A and the peak detection signals B and C. The dynamic hysteresis can be seen in FIG. 3B at the crossing points of waveforms A and F. When waveform A is in a positive portion of its cycle the analog switch 19 is closed onto signal E from the weighted average circuit 18. As the amplitude of signal A decreases it falls below the amplitude of signal E. Since the analog switch 19 during this time is closed onto signal E then signal F is identical to signal E. When signal A falls below signal F the comparator output 21 reverses polarity and thus causes the analog switch 19 to open the signal E input and close the signal D input. This causes a sudden shift in signal F as shown in FIG. 3B.

As the input signal A moves along on its negative cycle it needs to go some additional portion over one-half of its cycle in order to reach a crossing point with signal F which causes the comparator 21 to reverse polarity again. As can be seen in FIG. 3B the additional portion over one-half cycle that the input signal A must travel before it crosses signal F is dependent upon the magnitude of the input signal A. It is in this sense that the hysteresis of the limiter is dynamic.

Figure 4:
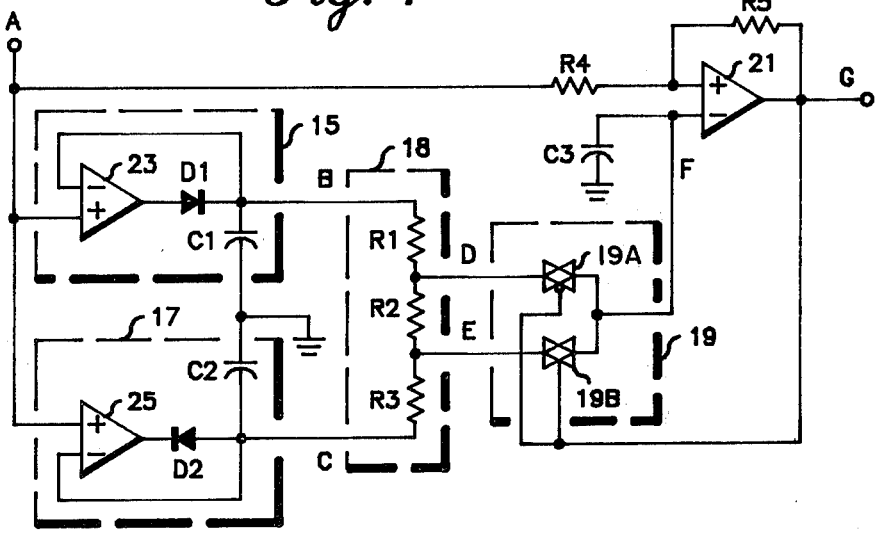
FIG. 4 is a schematic component diagram of the limiter circuit according to the invention.

FIG. 4 shows a detailed component schematic of the limiter with dynamic hysteresis according to the invention. A positive peak detector 15 is composed of a operational amplifier 23, a diode D1 and a capacitor C1. The negative peak detector 17 is composed of a operational amplifier 25, a diode D2, and a capacitor C2. The value of capacitors C1 and C2 are related to the frequency at the limiter input since the discharge time of the capacitors needs to be considerably longer than the frequency period of the input signal. A resistive series connected network R1, R2 and R3 compose the weighted average circuit 18. The outputs of the two peak detectors are connected at the two ends of the series connected resistive network R1, R2 and R3. Two voltages within this resistive network are chosen as inputs to the analog switch 19. The first voltage is taken between R1 and R2, while the second voltage is taken between R2 and R3. The resistive ladder R1, R2 and R3 serve a dual purpose. They provide a discharge path for capacitors C1 and C2 so that if the input signal is removed capacitors C1 and C2 will tend to discharge toward the average of their two previous values. More importantly though, the resistive ladder R1, R2 and R3 generate the two referenced voltages inputed to the analog switch 19.

$$V_D = \frac{V_C + [V_B - V_C][R2 + R3]}{[R1 + R2 + R3]}$$

$$V_E = \frac{V_C + [V_B - V_C][R3]}{[R1 + R2 + R3]}$$

For representative values R1=R3=3900 ohms; R2=390 ohms $$V_D = V_C + [V_B - V_C]*52.4\%$$

conversely $$V_E = V_C + [V_B - V_C]*47.6\%$$

Note that $V_D$ (voltage D in FIG. 4) is 2.4% higher than the midpoint between $V_C$ (voltage C in FIG. 4) and $V_B$ (voltage B in FIG. 4) while $V_E$ (voltage E in FIG. 4) is 2.4% lower than the midpoint. These two voltages ($V_D$ and $V_E$) are used to establish a 4.8% total hysteresis for the voltage comparator 21. For a rough estimate, the hysteresis of the limiter can be determined by the equation;

$$\% \text{ HYSTERESIS} = \frac{R2}{R1 + R3} \times 100$$

Resistors R4 and R5 provide a small additional amount of hysteresis by way of positive feedback for comparator 21. The positive feedback provides fixed hysteresis. This prevents the hysteresis from going to zero when the input signal level goes below the minimum desired dynamic range limit. The fixed hysteresis ensures the limiter will be stable at low input conditions since the fixed hysteresis voltage becomes a increasingly larger percentage of the input voltage as the input voltage decreases in magnitude to a point outside the 50 db dynamic range of the limiter.

As explained in connection with FIGS. 3A-C the hysteresis voltage F is generated by alternately selecting voltage D or E depending on the state of the comparator output G. Capacitor C3 ensures that the voltage transition between $V_D$ and $V_E$ occurs without switching transcients. Analog switch 19 can comprise a pair of transmission gates 20A and 20B as shown in FIG. 4. But the analog switch 19 is preferably a MC14053B chip. The analog switch is used as a single pole double toggle switch. The output of comparator 21 provides the control input for the transmission gates 19A and 19B. When the output of comparator 21 is high then the transmission gate 19B connects the negative peak detector voltage E output to the negative input of comparator 21. A high input to the control input of transmission gate 19A holds the gate in a off condition. Accordingly, if the output of the comparator 21 is low than the output D of positive peak detector 15 passes through transmission gate 19A and into the negative input of comparator 21. The amount of shift in the threshold voltage at the negative input of comparator 21, caused by the switching between voltage D and E, is a percentage fraction of the input signal A.

In summary, the invention is a limiter with dynamic hysteresis created by alternatively comparing a reference signal against voltage levels proportional to the positive and negative peaks of the reference signal.

I claim:

1. A method for creating a limiter circuit with dynamic hysteresis comprising the steps of:
    (1) detecting the positive and negative peaks of as input waveform,
    (2) taking at least two weighted averages of said positive and negative peaks,
    (3) alternately choosing one of said weighted averages,
    (4) comparing said input waveform with said chosen weighted average,
    (5) generating a first output signal if the chosen weighted average is greater than the input waveform and generating a second output signal if the chosen weighted average is less than the input waveform.

2. A method for creating a limiter circuit with dynamic hysteresis according to claim 1 with the additional step of:
   (5) choosing one of said weighted averages in response to the generated output signals.

3. A limiter circuit with dynamic hysteresis for providing improved distortion immunity at the circuit output in response to a input signal, the limiter comprising,
   detecting means for detecting the positive and negative peaks of said input signal,
   means for taking a plurality of weighted averages of said positive and negative peaks,
   comparator means having a first input responsive to said input signal,
   means for alternately choosing at least one of said plurality of weighted averages and applying said at least one weighted average to a second input of said comparator means to create a dynamic hysteresis effect.

4. A limiter circuit according to claim 3 wherein said means for alternately choosing at least one of said plurality of weighted averages is responsive to the output from said comparator means.

5. A limiter circuit according to claim 3 or 4 wherein said means for alternately choosing at least one of said plurality of weighted averages is an analog switch.

6. A limiter circuit according to claim 3 wherein said means for taking a plurality of weighted averages is a voltage divider network.

7. A limiter circuit according to claim 3 wherein said comparator means includes a fixed hysteresis voltage for stabilizing said limiter circuit output at low level voltage input signals.

8. A limiter circuit with dynamic hysteresis for providing improved distortion immunity at the circuit output in response to a input signal, the limiter comprising,
   means responsive to said input signal with a plurality of outputs proportional to said input signal,
   switch means for alternately choosing one of said plurality of outputs,
   comparator means responsive to said input signal and said switch means,
   feedback means responsive to said comparator means to control said switch means.

* * * * *

UNITED STATES PATENT AND TRADEMARK OFFICE
CERTIFICATE OF CORRECTION

PATENT NO. : 4,433,256
DATED : February 21, 1984
INVENTOR(S) : Arman V. Dolikian It is certified that error appears in the above—identified patent and that said Letters Patent is hereby corrected as shown below:

Col. 4, line 58, "as" should be --an--.

Signed and Sealed this

Seventh Day of August 1984

[SEAL]

Attest:

GERALD J. MOSSINGHOFF

Attesting Officer

Commissioner of Patents and Trademarks